US009490039B2

United States Patent
Kuwagaki et al.

(10) Patent No.: US 9,490,039 B2
(45) Date of Patent: *Nov. 8, 2016

(54) STRIP OF CU—CO—SI-BASED COPPER ALLOY FOR ELECTRONIC MATERIALS AND THE METHOD FOR PRODUCING THE SAME

(75) Inventors: Hiroshi Kuwagaki, Ibaraki (JP); Yasuhiro Okafuji, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 146 days.

This patent is subject to a terminal disclaimer.

(21) Appl. No.: 14/008,035

(22) PCT Filed: Mar. 15, 2012

(86) PCT No.: PCT/JP2012/056720
§ 371 (c)(1),
(2), (4) Date: Sep. 27, 2013

(87) PCT Pub. No.: WO2012/132937
PCT Pub. Date: Oct. 4, 2012

(65) Prior Publication Data
US 2014/0014241 A1 Jan. 16, 2014

(30) Foreign Application Priority Data
Mar. 29, 2011 (JP) .................. 2011-073270

(51) Int. Cl.
*C22C 9/06* (2006.01)
*C22F 1/08* (2006.01)
(Continued)

(52) U.S. Cl.
CPC ............... *H01B 1/026* (2013.01); *C22C 9/00* (2013.01); *C22F 1/08* (2013.01); *H01L 23/49579* (2013.01); *H01L 2924/0002* (2013.01)

(58) Field of Classification Search
CPC ............ C22C 9/06; C22C 9/10; C22F 1/00; C22F 1/08; H01B 1/026
USPC .................. 420/485–488, 490, 496; 148/554
See application file for complete search history.

(56) References Cited

U.S. PATENT DOCUMENTS 8,070,893 B2  12/2011  Era et al.
8,317,948 B2  11/2012  Era et al.
(Continued)

FOREIGN PATENT DOCUMENTS

CN    101168829 A   4/2008
CN    101646791 A   2/2010
(Continued)

OTHER PUBLICATIONS

Extended European Search Report for EP 12765097.6 dated Aug. 12, 2014.
(Continued)

*Primary Examiner* — Jessee Roe
*Assistant Examiner* — John Hevey
(74) *Attorney, Agent, or Firm* — Drinker Biddle & Reath LLP

(57) ABSTRACT

Cu—Co—Si-based alloy strip, which has not only an excellent balance between strength and electrical conductivity but also suppressed hanging curl, is provided. The copper alloy strip for electronic materials comprises 0.5-2.5 mass % of Co, 0.1-0.7 mass % of Si, the balance Cu and inevitable impurities, wherein, from a result obtained from measurement of an X ray diffraction pole figure, using a rolled surface as a reference plane, the following (a) is satisfied. (a) A diffraction peak height at β angle 120° among diffraction peak intensities by β scanning at α=25° in a {200} pole figure is at least 10 times that of standard copper powder.

7 Claims, 3 Drawing Sheets

(51) Int. Cl.
   *H01B 1/02* (2006.01)
   *H01L 23/495* (2006.01)
   *C22C 9/00* (2006.01)

(56) References Cited

U.S. PATENT DOCUMENTS

| | | | |
|---|---|---|---|
| 8,444,779 B2 | 5/2013 | Era et al. | |
| 2004/0079456 A1* | 4/2004 | Mandigo et al. | 148/554 |
| 2007/0062619 A1* | 3/2007 | Maehara et al. | 148/554 |
| 2008/0056930 A1 | 3/2008 | Ito et al. | |
| 2008/0099110 A1 | 5/2008 | Muroga et al. | |
| 2009/0165899 A1 | 7/2009 | Sakai et al. | |
| 2010/0170595 A1 | 7/2010 | Kaneko et al. | |
| 2010/0326573 A1 | 12/2010 | Mihara et al. | |
| 2011/0027122 A1 | 2/2011 | Era et al. | |
| 2011/0186192 A1 | 8/2011 | Mihara et al. | |
| 2011/0240182 A1 | 10/2011 | Kuwagaki | |
| 2011/0244260 A1 | 10/2011 | Kuwagaki | |
| 2012/0031533 A1 | 2/2012 | Onda et al. | |
| 2013/0022492 A1* | 1/2013 | Kuwagaki | 420/473 |
| 2013/0087255 A1 | 4/2013 | Kuwagaki | |
| 2013/0263978 A1* | 10/2013 | Kuwagaki | 148/554 |
| 2014/0014240 A1* | 1/2014 | Okafuji et al. | 148/554 |

FOREIGN PATENT DOCUMENTS

| | | |
|---|---|---|
| CN | 101680056 A | 3/2010 |
| CN | 101952465 A | 1/2011 |
| JP | 07-011363 A | 1/1995 |
| JP | 2005-532477 A | 10/2005 |
| JP | 2006-283059 A | 10/2006 |
| JP | 200792135 A | 4/2007 |
| JP | 2007-169765 A | 7/2007 |
| JP | 2008-013836 A | 1/2008 |
| JP | 2008-056977 A | 3/2008 |
| JP | 2008-106312 A | 5/2008 |
| JP | 2008-106313 A | 5/2008 |
| JP | 2009-242890 A | 10/2009 |
| JP | 2009-242921 A | 10/2009 |
| JP | 2010-215976 A | 9/2010 |
| JP | 2010236071 A | 10/2010 |
| JP | 2011214088 A | 10/2011 |
| JP | 2011252209 A | 12/2011 |
| TW | 201003674 A | 1/2010 |
| WO | 2004/005560 A2 | 1/2004 |
| WO | 2007148712 A1 | 12/2007 |
| WO | 2010/013790 A1 | 2/2010 |
| WO | 2010/064547 A1 | 6/2010 |
| WO | 2010113553 A1 | 10/2010 |

OTHER PUBLICATIONS

English translation of the International Preliminary Report on Patentability for PCT/JP2012/056720 dated Oct. 10, 2013.
Office Action for U.S. Appl. No. 13/638,431 dated Jan. 12, 2015.
Office Action for U.S. Appl. No. 13/638,431 dated Jun. 25, 2015.
Office Action for U.S. Appl. No. 13/638,431 dated Dec. 16, 2015.
Office Action for U.S. Appl. No. 13/993,648 dated Apr. 22, 2015.
Office Action for U.S. Appl. No. 13/993,648 dated Jun. 26, 2015.
Office Action for U.S. Appl. No. 13/993,648 dated Dec. 15, 2015.
Office Action for U.S. Appl. No. 14/006,735 dated Apr. 22, 2015.
Office Action for U.S. Appl. No. 14/006,735 dated Jun. 26, 2015.
Office Action for U.S. Appl. No. 14/006,735 dated Dec. 17, 2015.

* cited by examiner

STRIP OF CU—CO—SI-BASED COPPER ALLOY FOR ELECTRONIC MATERIALS AND THE METHOD FOR PRODUCING THE SAME

TECHNICAL FIELD

The present invention relates to a precipitation-hardened copper alloy, and more particularly to a strip of Cu—Co—Si-based copper alloy which can be advantageously used in various electronic components.

TECHNICAL BACKGROUND

Copper alloys for electronic materials used in various electronic components such as connectors, switches, relays, pins, terminals, lead frames and the like are required to satisfy both of high strength and high electrical conductivity (or thermal conductivity) as fundamental properties. In recent years, high integration, miniaturization and reduction of thickness of electronic components are rapidly progressing and correspondingly the requested level for the copper alloys used in the parts for these electronic devices has been becoming higher and higher.

From the aspects of high strength and high electrical conductivity, the use of precipitation-hardened copper alloy as copper alloy for electronic materials is increasing in amount, in place of the conventional solid solution-strengthened type alloys represented by phosphor bronze, brass or the like. With respect to the precipitation-hardened copper alloy, a supersaturated solid solution, which has been subjected to solution treatment, is subjected to ageing treatment, whereby fine precipitates are homogeneously dispersed and not only the strength but also the electrical conductivity of the alloy are increased, because of the decreased amount of solid solution elements in the copper. For this reason, a material which excels not only in the mechanical strength of the alloy such as strength and resilience but also in the electrical conductivity and thermal conductivity can be obtained.

Among the precipitation-hardened copper alloys, Cu—Ni—Si-based copper alloy (generally called Corson alloy) is one of typical copper alloys which have a relatively high electrical conductivity, a high mechanical strength and a high bending workability and is currently being actively developed in the industries concerned. With this copper alloy, the strength and the electrical conductivity are both improved by precipitating fine particles of Ni—Si-based intermetallic compound in the copper matrix.

Recently, an attempt of improving the properties of Cu—Co—Si-based copper alloy in place of the Cu—Ni—Si-based copper alloy is underway. For example, Japanese Patent Application Publication No. 2010-236071 (Patent document 1) discloses, for the purpose of obtaining a Cu—Co—Si-based alloy having superior mechanical and electrical properties as well as uniform mechanical properties, a copper alloy for electronic materials containing 0.5-4.0 mass % of Co, 0.1-1.2 mass % of Si and balance Cu and unavoidable impurities, wherein the average crystal particle size is 15-30 µm, and the average difference between the maximum grain particle diameter and the minimum grain particle diameter per each field of view of 0.5 mm² is 10 µm or less.

The process of producing copper alloy disclosed in the patent document comprises the following sequential steps:
step 1 of melting and casting an ingot having a desired composition;
step 2 of heating the ingot to 950-1050° C. for at least one hour and thereafter subjecting it to hot rolling,
step 3 of cold rolling with a working ratio of at least 70%;
step 4 of aging treatment at 350-500° C. for 1-24 hours;
step 5 of performing solution treatment at 950-1050° C., and then cooling the material temperature with an average cooling rate of at least 15° C./sec from 850° C. to 400° C.;
optional step 6 of cold rolling;
step 7 of ageing treatment; and
optional step 8 of cold rolling.

PRIOR ART DOCUMENT

Patent Document

Japanese Patent Application Publication No. 2010-236071

SUMMARY OF THE INVENTION

Problem to be Solved by the Invention

Although the copper alloy described in Patent document 1 provides a Cu—Co—Si-based alloy for electronic materials having superior mechanical and electrical properties, there is still room for improving the spring bending elastic limit.

Also, the present inventors have come across a problem that, in producing strips on the industrial scale, the shape accuracy is insufficient and especially hanging curl has not been sufficiently controlled. Hanging curl is a phenomenon that the material is curled over the rolling direction. In the process of producing strip products, the aging treatment is usually conducted in a batch furnace from the standpoint of the production efficiency and the production facility. However, in such batch process, the material is heat-treated in coiled condition and thus the curling tendency is imparted. As a result, the shape (hanging curl) is deteriorated. Once hanging curl is formed, the shape during and after the press working for electronic material is not stable, namely, the accuracy of dimension is reduced. Accordingly, it is desired to suppress hanging curl as much as possible.

Therefore, an object of the present invention is to provide a Cu—Co—Si-based alloy strip having not only a superior balance among strength, electrical conductivity and spring bending elastic limit, but also a suppressed hanging curl. Another object of the present invention is to provide a method for producing such Cu—Co—Si-based alloy strip.

Means for Solving the Problem

In order to solve the above-mentioned problems, the inventors have conducted extensive studies and have discovered that, the Cu—Co—Si-based alloy strip obtained by performing after solution treatment an aging treatment and a cold rolling in this sequence has a suppressed hanging curl in addition to a superior balance among strength, electrical conductivity and spring bending elastic limit, if the aging treatment is conducted in three stages under specific temperature and time conditions.

It has been found that the copper alloy strip produced according to this method has such a singularity that, when the ratio of the diffraction intensity for β to that of the copper powder is calculated for each angle α as measured by the X-ray diffraction pole figure method using the rolled surface as the reference plane, a ratio of a peak height at α=25° and β=120° in a {200} pole figure to that of standard copper powder is at least 10. The reason why such diffraction peak was obtained is not clear but it is considered that fine distribution of secondary phase particles exerts an influence.

The present invention has been completed based on this discovery and provides, in one aspect, a copper alloy strip for electronic materials comprising 0.5-2.5 mass % of Co, 0.1-0.7 mass % of Si, the balance Cu and inevitable impurities, wherein, from a result obtained from measurement of an X ray diffraction pole figure, using a rolled surface as a reference plane, the following (a) is satisfied.

(a) A diffraction peak height at β=120° among peak intensities by β scanning at α=25° in a {200} pole figure is at least 10 times that of standard copper powder.

The copper alloy strip according to one embodiment of the present invention has a hanging curl in a direction parallel with a rolling direction is 35 mm or less.

The copper alloy strip according to another embodiment of the present invention satisfies the following formula where Co content (mass %) is expressed by [Co] and 0.2% yield strength is expressed by YS (MPa).

$$-55 \times [Co]^2 + 250 \times [Co] + 500 \geq YS \geq -55 \times [Co]^2 + 250 \times [Co] + 350 \quad \text{Formula a:}$$

The copper alloy strip according to a further embodiment of the present invention satisfies the following formulae where 0.2% yield strength is expressed by YS (MPa) and the electrical conductivity is expressed by EC (% IACS).

$$500 \leq YS \leq 800, \; 50 \leq EC \leq 75$$

$$-0.117 \times [YS] + 130 \leq EC \leq -0.117 \times [YS] + 154 \quad \text{Formula b:}$$

The copper alloy strip according to a further embodiment of the present invention satisfies the following formula where Co content (mass %) is expressed by [Co] and spring bending elastic limit is expressed by Kb (MPa).

$$60 \times [Co] + 265 \leq Kb \leq 60 \times [Co] + 375 \quad \text{Formula c:}$$

The copper alloy strip according to a further embodiment of the present invention contains less than 1.0 mass % of Ni.

The copper alloy strip according to a further embodiment of the present invention contains at most 2.0 mass % in total of at least one element selected from the group consisting of Cr, Mg, P, As, Sb, Be, B, Mn, Sn, Ti, Zr, Al, Fe, Zn, and Ag.

According to another aspect of the present invention, the present invention provides a method for producing a copper alloy strip, which comprises steps in the following sequence:

step 1 of melting and casting an ingot of copper alloy having any one of the above-mentioned compositions;

step 2 of heating the ingot at 900° C.-1050° C. for at least 1 hour, and thereafter subjecting it to a hot rolling;

step 3 of cold rolling;

step 4 of conducting solution treatment at 850-1050° C. and then cooling with an average cooling rate to 400° C. of at least 10° C./sec;

multi-stage aging step 5 comprising a first stage of heating the material at 480° C.-580° C. for 1-12 hours, then a second stage of heating the material at 430-530° C. for 1-12 hours, and then a third stage of heating the material at 300-430° C. for 4-30 hours, wherein the cooling rates from the first stage to the second stage and from the second stage to the third stage are at least 0.1° C./min respectively, and a temperature difference between the first stage and the second stage is 20-80° C. and a temperature difference between the second stage and the third stage is 20-180° C. and wherein the multiple stage aging is performed in a batch furnace with the material in a coiled condition, and step 6 of cold rolling.

The method for producing a copper alloy strip further comprises, in one embodiment, after the step 6, a thermal refining annealing step of heating the material at a temperature of 200-500° C. for 1-1000 seconds.

In a further aspect, the present invention provides a wrought copper product obtained by processing the copper alloy strip of the present invention.

In a further aspect, the present invention provides an electronic component obtained by processing the copper alloy strip of the present invention.

Effects of the Invention

According to the present invention, a Cu—Co—Si-based alloy strip having not only an excellent balance among strength, electrical conductivity and spring bending elastic limit, but also having a suppressed hanging curl is obtained.

BRIEF EXPLANATION OF THE INVENTION

MODES OF PRACTICING THE INVENTION

Addition Amount of Co and Si

Figure 1:
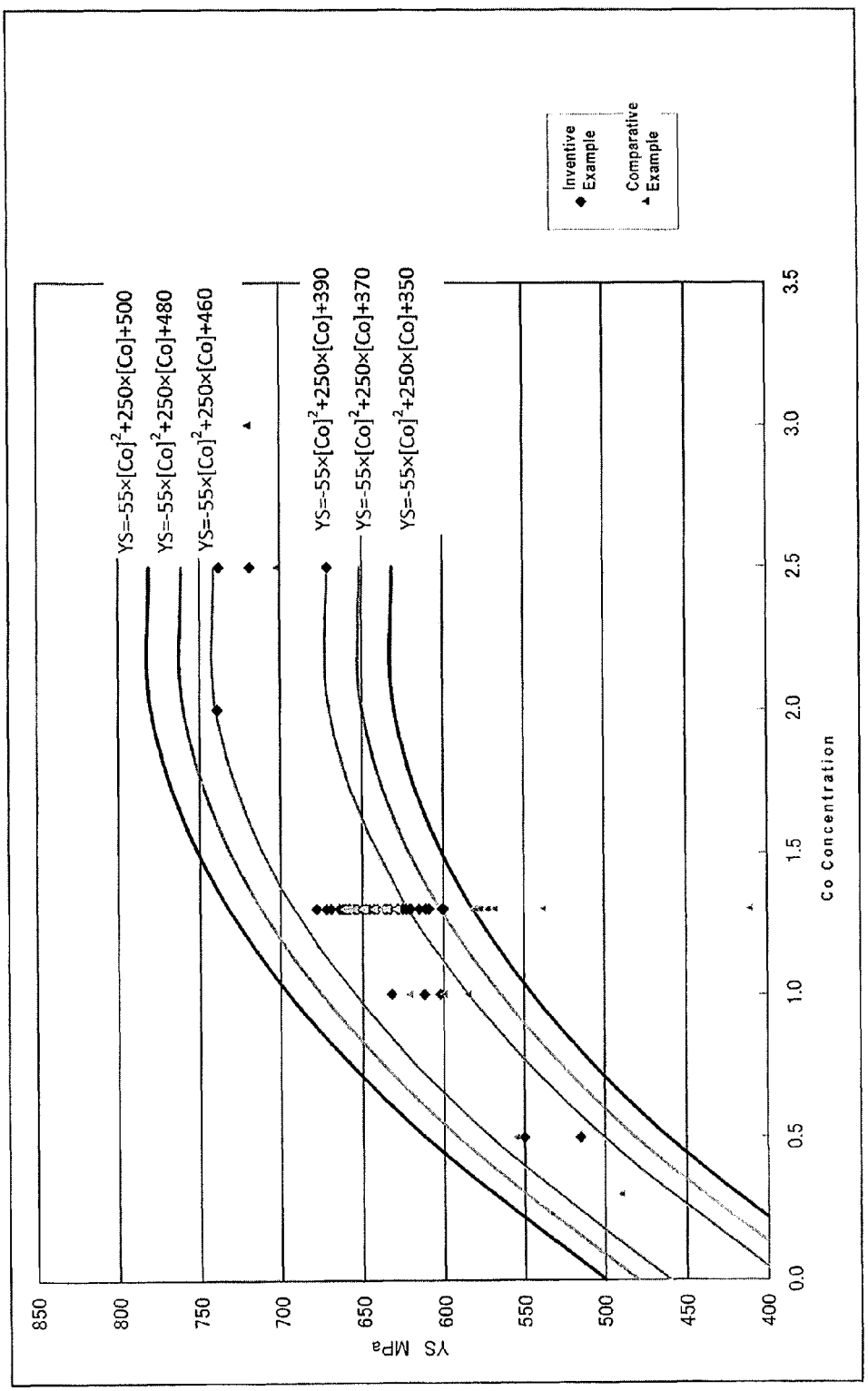
FIG. 1 is a graph plotted with the Co mass % concentration as x-axis and the YS as the y-axis.

Co and Si form an intermetallic compound by subjecting to an appropriate heat treatment, whereby the strength is enhanced without deteriorating the electrical conductivity.

If the added amounts of Co and Si are such that Co is less than 0.5 mass % or Si is less than 0.1 mass %, the desired strength is not obtained. On the other hand, if Co is more than 2.5 mass % or Si is more than 0.7 mass %, not only the effect of the increase in strength is saturated but also the bending workability and the hot workability are deteriorated. Accordingly, preferable quantities to be added of Co and Si are Co: 0.5-2.5 mass % and Si: 0.1-0.7 mass %, respectively. More preferable added quantities of Co and Si are Co: 1.0-2.0 mass % and Si: 0.3-0.6 mass %, respectively.

Further, if the ratio Co/Si of mass concentrations of Co to Si is too low, or Si to Co is excessively high, the electrical conductivity is lowered due to the Si solid solution, or the soldering property is lowered due to formation of an oxide film of $SiO_2$ on the surface of a material during annealing step. On the other hand, if the ratio of Co to Si is too high, Si for forming silicide becomes insufficient, thereby making it difficult to obtain a high strength.

Accordingly, it is preferable to control the ratio Co/Si in the alloy composition in the range of 3≤Co/Si≤5, and more preferably 3.7≤Co/Si≤4.7.

Addition Amount of Ni

Ni re-solves by solution treatment or the like, and forms an intermetallic compound with Si during subsequent aging precipitation, so as to enhance strength with little losing electrical conductivity. However, when the Ni concentration is 1.0 mass % or more, Ni which could not be precipitated by aging solves in the matrix phase, thereby lowering the electrical conductivity. Accordingly, Ni can be added at less than 1.0 mass % to the Cu—Co—Si based alloy according to the present invention. Less than 0.03 mass % is not very effective and accordingly addition of at least 0.03 mass % but less than 1.0 mass %, more preferably 0.09-0.5 mass % is recommended.

Addition Amount of Cr

Cr can strengthen grain boundary because Cr is preferentially precipitated in the grain boundary area during the cooling process at the time of melting and casting, so that generation of cracking during the hot working is suppressed and the lowering in the yield ratio is suppressed. In other words, although the Cr precipitated in the boundary during the melting and casting process forms solid solution again by the solution treatment, but during the subsequent aging precipitation, precipitated particles of a bcc structure consisting mainly of Cr or compounds with Si are formed. Among the quantity of the added Si, the Si that did not contribute to the aging precipitation remains as solid solution in the matrix phase and restricts the increase in the electrical conductivity. However, by adding Cr, which is an element capable of forming silicate, silicate is further precipitated to decrease the amount of the Si solid solution, whereby the electrical conductivity can be increased without lowering the strength. However, when the Cr concentration exceeds 0.5 mass %, more specifically 2.0 mass %, coarse second-phase particles tend to be formed and the quality of the product will be impaired. Accordingly, Cr may be added to the Cu—Co—Si based alloy of the present invention in an amount of 2.0 mass % at most. As the amount of less than 0.03 mass % is too small to attain its effect, preferably 0.03-0.5 mass %, more preferably 0.09-0.3 mass %, are added.

Addition Amount of Mg, Mn, Ag and P

Addition of a very small amount of Mg, Mn, Ag and P improves the product properties such as strength, stress relaxation property without impairing the electrical conductivity. The effectiveness of the addition is mainly achieved by the formation of solid solution in the matrix phase but its inclusion into the second-phase particles can further enhance the effectiveness. However, when the total concentration of Mg, Mn, Ag and P exceeds 2.0 mass %, the effect of improvement of the properties is saturated and the productivity is impaired. Accordingly, one or more selected from Mg, Mn, Ag and P can be added to the Cu—Co—Si based alloy of the present invention at the total concentration of 2.0 mass % at most, preferably 1.5 mass % at most. However, the effectiveness is slight at less than 0.01 mass % and accordingly the preferred amount is 0.01-1.0 mass %, and more preferably 0.04-0.5 mass % in total.

Addition Amount of Sn and Zn

Also, addition of a slight amount of Sn and Zn improves the product properties such as strength, stress relaxation property, plating property, etc. without impairing the electrical conductivity. The effectiveness by the addition is mainly obtained by the solid solution into the matrix phase. However, if the total quantity of Sn and Zn exceeds 2.0 mass %, the effectiveness for the improvement of the properties is saturated and impairs the productivity. Accordingly, at least one of Sn and Zn may be added to the Cu—Co—Si based alloy of the present invention in a total quantity of 2.0 mass % at the maximum. However, since the effectiveness is slight at less than 0.05 mass %, preferably 0.05-2.0 mass %, more preferably 0.5-1.0 mass % is added in total.

Addition Amount of As, Sb, Be, B, Ti, Zr, Al and Fe

Also, with respect to As, Sb, Be, B, Ti, Zr, Al and Fe, by adjusting their total amount of addition depending on the required product properties, the product properties such as electrical conductivity, strength, stress relaxation property, plating property are improved. The effectiveness of the addition is mainly achieved by their solid solution into the matrix phase but their inclusion into the second-phase particles or formation of new second-phase particles can further enhance the effectiveness. However, if the total quantity of these elements exceeds 2.0 mass %, the effectiveness for the improvement of the properties is saturated and impairs the productivity. Accordingly, at least one selected from As, Sb, Be, B, Ti, Zr, Al and Fe can be added to the Cu—Co—Si based alloy in a quantity of up to 2.0 mass % in total. However, less than 0.001 mass % has little effect and accordingly 0.001-2.0 mass %, more preferably 0.05-1.0 mass % in total is added.

If a total addition amount of the above-mentioned Ni, Cr, Mg, Mn, Ag, P, Sn, Zn, As, Sb, Be, B, Ti, Zr, Al and Fe exceeds 2.0 mass %, the productivity tends to be impaired. Accordingly, the total quantity of these elements is 2.0 mass % or less and more preferably 1.5 mass % or less.

Grain Orientation

The copper alloy strip according to one embodiment of the present invention satisfies that, from a result obtained from measured ratio of the diffraction intensity for β to that of the standard copper powder at each angle α as measured by the X-ray diffraction pole figure method using a rolled surface as a reference plane, the ratio of the peak height at α=25° and β=120° in the {200} pole figure to that of the standard copper powder (hereinafter called "the ratio of the peak height at β angle 120° at α=25°") is at least 10 times.

The ratio of the peak height at β angle 120° at α=25° is preferably at least 15 times, more preferably at least 20 times, and typically 10-40 times, more typically 15-30 times. The standard copper powder is defined by a copper powder having 325 mesh (JIS Z8801) and a purity of 99.5%.

Although the reason is not necessarily clear as to why not only an excellent balance among strength, electrical conductivity and spring bending elastic limit is obtained but also hanging curl is suppressed by controlling the peak height at angle β=120° for α=25° in the diffraction peak of {200} plane, it is inferred that, by performing the first aging treatment as three stage aging, work strain is difficult to build up in the subsequent cold rolling step and thus a peculiar grain orientation grown up until after the aging treatment remains, so that the spring bending elastic limit is enhanced.

The peak height at β angle 120° at α=25° among the diffraction peaks in the {200} Cu plane is measured by the pole figure measurement. The pole figure measurement is a method in which one diffraction plane {hkl} of Cu is taken up and stepwise a-axis scanning is performed for 2θ value in the {hkl} Cu plane (the scanning angle 2θ of the detector is fixed), and the β axis scanning (0 to 360° in-plane rotation (axial rotation)) is performed on the specimen for each angle α. In the XRD pole figure measurement in the present invention, the angle normal to the plane of the specimen was defined as α=90° and was used as a reference of measurement. Further, the pole figure measurement is performed by reflection method (α=from −15° to 90°). The peak height at β=120° at α=25° among the diffraction peaks in the {200} Cu plane is defined as the strongest intensity among the range β=115-125' when intensities for β angle is plotted at α=25°.

Properties

The copper alloy strip according to one embodiment of the present invention can satisfy the following formula where Co content (mass %) is expressed by [Co] and 0.2% yield strength is expressed by YS (MPa).

$$-55 \times [Co]^2 + 250 \times [Co] + 500 \geq YS \geq -55 \times [Co]^2 + 250 \times [Co] + 350 \quad \text{Formula a:}$$

The copper alloy strip according to a preferred embodiment of the present invention can satisfy the following formula.

$$-55\times[Co]^2+250\times[Co]+480 \geq YS \geq 55\times[Co]^2+250\times[Co]+370 \quad \text{Formula a'}$$

The copper alloy strip according to a more preferred embodiment of the present invention can satisfy the following formula.

$$-55\times[Co]^2+250\times[Co]+460 \geq YS \geq -55\times[Co]^2+250\times[Co]+390 \quad \text{Formula a'''}$$

The copper alloy strip according to one embodiment of the present invention has a hanging curl parallel with the rolling direction is 35 mm or less, preferably 20 mm or less, more preferably 15 mm or less, and for example 10-30 mm.

In the present invention, hanging curl in the direction parallel with a rolling direction is determined according to the following procedure. An elongated specimen having a length of 500 mm parallel to the rolling direction and a width of 10 mm perpendicular to the rolling direction is cut out from the strip material to be tested. This specimen is grasped at one end in the elongated direction and the other end is hanging downwardly and the warped amount from the vertical line is named "hanging curl". Incidentally, although according to the present invention the hanging curl is determined as defined above, almost the same measurement result will be obtained for specimens with an elongated shape having a length of 500-1000 mm in the direction parallel with the rolling direction and a width of 10-50 mm in the direction perpendicular to the rolling direction.

The copper alloy strip according to an embodiment of the present invention satisfies the following, where 0.2% yield strength is expressed by YS (MPa) and electrical conductivity is expressed by EC (% IACS).

$$500 \leq YS \leq 800, \; 50 \leq EC \leq 75 \text{ and}$$

$$-0.117\times[YS]+130 \leq EC \leq 0.117\times[YS]+154 \quad \text{Formula b}$$

The copper alloy strip according to a preferred embodiment of the present invention satisfies the following.

$$520 \leq YS \leq 780, \; 51 \leq EC \leq 74 \text{ and}$$

$$-0.117\times[YS]+134 \leq EC \leq -0.117\times[YS]+150 \quad \text{Formula b'}$$

The copper alloy strip according to a more preferred embodiment of the present invention satisfies the following.

$$540 \leq YS \leq 760, \; 52 \leq EC \leq 73 \text{ and}$$

$$-0.117\times[YS]+138 \leq EC \leq -0.117\times[YS]+146 \quad \text{Formula b''}$$

The copper alloy strip according to an embodiment of the present invention can satisfy the following, where the Co content (mass %) is expressed by [Co] and the spring bending elastic limit is expressed by Kb (MPa).

$$60\times[Co]+265 \leq Kb \leq 60\times[Co]+375 \quad \text{Formula c}$$

The copper alloy strip according to a preferred embodiment of the present invention can satisfy the following.

$$60\times[Co]+275 \leq Kb \leq 60\times[Co]+365 \quad \text{Formula c'}$$

The copper alloy strip according to a more preferred embodiment of the present invention can satisfy the following.

$$60\times[Co]+285 \leq Kb \leq 60\times[Co]+355 \quad \text{Formula c''}$$

Method of Production

In a general method of producing Corson copper alloy, firstly an atmospheric melting furnace is used to melt electrolytic cathode copper, Si, Co and other raw materials to obtain a molten metal of a desired composition. This molten metal is casted into an ingot. Thereafter, the ingot is subjected to hot rolling, and then cold rolling and heat treatment are repeated, thereby obtaining a strip or a foil of desired thickness and properties. The heat treatment includes solution treatment and aging treatment. In the solution treatment, the material is heated to a high temperature of about 700 to about 1000° to solve the second-phase particles into the Cu matrix to form a solid solution and at the same time the Cu matrix is re-crystallized. Hot rolling sometimes doubles as the solution treatment. In the aging treatment, the material is heated for 1 hour or more in a temperature range of about 350 to about 550° C., and second-phase particles formed into a solid solution in the solution treatment are precipitated as microparticles on a nanometer order. The aging treatment results in increased strength and electrical conductivity. Cold rolling is sometimes performed before and/or after the aging treatment in order to obtain higher strength. Also, stress relief annealing (low-temperature annealing) is sometimes performed after cold rolling in case where cold rolling is carried out after aging.

Grinding, polishing, shot blast, pickling, and the like may be carried out as needed in order to remove oxidized scale on the surface between each of the above-described steps.

The copper alloy according to the present invention, too, experiences these production processes, but in order to obtain the final copper alloy having properties within the ranges as defined by the present invention, it is essential that the solution treatment and the subsequent steps are carried out under strictly controlled conditions. This is because, in the Cu—Co—Si-based alloy of the present invention, unlike the conventional Cu—Ni—Si-based Corson alloy, the element Co, which is difficult to control the second-phase particles, is added as an essential component for the aging precipitation hardening. This is because Co forms the second-phase particles together with Si, but its formation and growth rate are sensitive to the retention temperature and cooling rate.

First of all, as it is unavoidable that coarse crystallites are formed during the solidification in the casting step and coarse precipitates are formed during the cooling step, it is necessary in the succeeding step to solve the second-phase particles into the matrix phase. Co can solve in the matrix phase by retaining the material at 900-1050° C. for at least one hour and then subjecting it to hot rolling. The temperature condition of at least 900° C. is higher than the other Corson alloys. If the retention temperature is less than 900° C., the solid solution is not sufficiently formed. At the temperature condition above 1050° C., there is a possibility of melting the material. It is also desirable to quench the material swiftly after the completion of the hot rolling.

The solution treatment has the objects of dissolving the crystallites formed at the time of the casting and the precipitated particles after hot rolling into the solid solution, thereby enhancing the age hardening ability after the hot rolling. In this treatment, the retention temperature and time, and the quenching rate after the retention become important. If the retention time is fixed, the crystallites formed at the time of melt casting and the precipitated particles after the hot rolling can be solved into the solid solution at a higher retention temperature.

The solution treatment may be conducted either in a continuous furnace or in a batch furnace but, for industrial production as of the strip in the present invention, it is preferred to use the continuous furnace from the standpoint of production efficiency.

The grater the cooling rate is after the solution treatment, the more the precipitation can be suppressed during the cooling process. If the cooling rate is too slow, coarser second-phase particles will grow during the cooling process and thus the Co and Si contents will increase in the second-phase particles, whereby a sufficient solid solution will not be attained by the solution treatment and the age hardening capability will decrease. Therefore, the cooling after the solution treatment is preferably a quenching. More specifically, following the solution treatment at 850° C.-1050° C. for 10-3600 seconds, a cooling process is conducted at an average cooling rate of at least 10° C./sec, preferably at least 15° C./sec, more preferably at least 20° C./sec, down to a temperature of 400° C. There is no particular upper limit but the upper limit is 100° C./sec or less according to the specification of the facility. Here, the "average cooling rate" means the value (° C./sec) determined by measuring the cooling time from the temperature of the solution treatment to 400° C. and calculating the value (° C./sec)=(temperature of solution treatment−400)(° C.)/cooling time (sec). Incidentally, the cooling rate below 400° C. does not matter because the precipitation of the second-phase particles is remarkable only down to 400° C.

As a method for quick cooling, water cooling is the most effective. As the cooling rate varies depending on the temperature of the water used for water cooling, the cooling rate can be made quicker by controlling the temperature of the water. If the water is 25° C. or higher, there could be cases where the desired cooling rate is not obtained, and accordingly it is preferable to maintain the temperature at 25° C. or lower. If the material is cooled in a bath retaining water, the water temperature tends to exceed 25° C., and accordingly it is desirable to prevent the temperature increase by spraying water in the form of mist or shower or by flowing cold water in the water bath all the time. Also, the cooling rate can be increased by increasing the number of water-cooling nozzles or by increasing the quantity of water per unit time.

The manufacture of the Cu—Co—Si-based alloy strip according to the present invention is effectively carried out by conducting the solution treatment, and thereafter the aging treatment, the cold rolling, and the optional thermal refining annealing in this sequence, wherein the aging treatment is carried out as three stage aging. That is, by adopting the three stage aging, strength and electrical conductivity are enhanced, and thereafter the cold rolling is carried out to reduce hanging curl. It is considered that the reason why strength and electrical conductivity were significantly enhanced by the three stage aging after the solution treatment is the growth of the second-phase particles precipitated during the first and second stages as well as precipitation of the second-phase particles during the third stage.

In the three stage aging, the first stage is conducted by heating the material at 480-580° C. for 1-12 hours. The first stage aims at enhancing strength and electrical conductivity by the nucleation and growth of the second-phase particles.

If the temperature of the material is lower than 480° C. or the heating time is less than 1 hour in the first stage, the volume fraction of the second-phase particles is too small to obtain the desired strength and electrical conductivity. On the other hand, if the heating is conducted until the temperature of the material exceeds 580° C. or the heating time exceeds 12 hours, the volume fraction of the second-phase particles becomes large but there is a growing tendency to decrease strength due to coarsening.

After completion of the first stage, the process is switched over to the aging temperature for the second stage by setting the cooling rate at 0.1° C./min or more. The reason why the cooling rate is set at this value is to avoid excessive growth of the second-phase particles which were precipitated in the first stage. If the cooling rate is too rapid, the undershooting becomes too large and accordingly 100° C./min or less is preferable. The cooling rate here is measured by (first stage aging temperature−second stage aging temperature)(° C.)/(cooling time (min) from the first stage aging temperature to the arrival at the second stage aging temperature).

Then, the second stage is carried out at the material temperature of 430-530° C. for 1-12 hours. The second stage is for enhancing electrical conductivity by growing the second-phase particles precipitated in the first stage to the extent they can contribute to strength, and for obtaining higher strength and electrical conductivity by causing precipitation of the fresh second-phase particles (smaller than the second-phase particles precipitated in the first stage).

If the temperature of the material in the second stage is less than 430° C. or the heating time is less than 1 hour, the second-phase particles precipitated in the first stage cannot grow and accordingly it is difficult to increase electrical conductivity. Also, in the second stage the second-phase particles will not be newly precipitated and accordingly it is difficult to increase strength and electrical conductivity. On the other hand, if the temperature of the material exceeds 530° C. or the heating time exceeds 12 hours, the secondary phase particles precipitated in the first stage will excessively grow to become coarse, impairing strength.

If the temperature difference between the first and second stages is too small, the second-phase particles precipitated in the first stage will become coarse and cause reduction of strength, while if the difference is too large, the second-phase particles precipitated in the first stage will little grow and electrical conductivity cannot be improved. Also, in the second stage second-phase particles are difficult to precipitate, strength and electrical conductivity cannot be increased. For these reasons, the temperature difference between the first and second stages should be 20-80° C.

After finishing the second stage, for the same reason as mentioned earlier, the cooling rate is set at 0.1° C./min or more and the process is switched over to the third stage aging temperature. Similarly, the cooling rate is preferably 100° C./min or less. The cooling rate here is measured by (second stage aging temperature−third stage aging temperature)(° C.)/(cooling time (min) from the second stage aging temperature to the arrival at the third stage aging temperature).

Next, the third stage is conducted at the material temperature of 300-430° C. for 4-30 hours. The third stage is for growing a little the second-phase particles precipitated in the first and second stages and for generating fresh second-phase particles.

If the temperature of the material in the third stage is less than 300° C. or the heating time is less than 4 hours, it will not be possible to make the second-phase particles precipitated in the first and second stages grow or to generate fresh second-phase particles. Accordingly it is difficult to obtain a desired strength, electrical conductivity and spring bending elastic limit. On the other hand, if the heating is conducted until the temperature of material exceeds 430° C. or the heating time exceeds 30 hours, the second-phase particles precipitated in the first and second stages will excessively grow to become coarse and thus desired strength are difficult to achieve.

If the temperature difference between the second and the third stages is too small, the second-phase particles precipitated in the first and second stages will excessively grow, causing lower strength, while if the difference is too large, the second-phase particles formed in the first and second stages will little grow and electrical conductivity cannot be improved. Also, second-phase particles are difficult to be precipitated in the third stage, strength and electrical conductivity cannot be enhanced. For these reasons, the temperature difference between the second and third stages should be 20-180° C.

In a single aging treatment stage, the temperature should be kept constant as a rule since the distribution of the second-phase particles might be changed. However, fluctuation of ±5° C. from the setting temperature is allowable. Accordingly, each stage is conducted within a temperature fluctuation of 10° C.

After the aging treatment, a cold rolling is carried out. This cold rolling provides the effects that the insufficient aging hardening in the aging treatment is supplemented by the work hardening and the curling tendency generated in the aging treatment which becomes the cause of hanging curl is reduced. The working ratio (rolling reduction ratio) in this case is preferably 10-80%, more preferably 20-60%, to obtain a desired strength and to reduce the curing tendency. If the working ratio is too high, the bending workability is deteriorated, while if it is too small, the suppression of hanging curl is not sufficient.

After the cold rolling, no more heat treatment is necessary. This is because, if the aging treatment is effected again, there is a fear that the reduced curling tendency could be restored. However, the thermal refining annealing is allowable.

If the thermal refining annealing is carried out, the temperature conditions are 200-500° C. for 1-1000 seconds. By the thermal refining annealing, the increased resilience is obtained.

The Cu—Si—Co-based alloy strip according to the present invention can be worked into various wrought products such as plates, foils, tubes, rods and wires. Further, the Cu—Si—Co-based alloy according to the present invention can be used in electronic components such as lead frames, connectors, pins, terminals, relays, switches, foils for secondary batteries, etc.

The plate thickness of the copper alloy strip according to the present invention is not particularly restricted, but is 0.005 mm-1.500 mm, for example. Preferably, the thickness is 0.030 mm-0.900 mm, more preferably 0.040 mm-0.800 mm, and further more preferably 0.050 mm-0.400 mm.

EXAMPLES

Although the present invention will be explained in the following by examples and comparative examples, it should be understood that they are presented for better understanding of the invention and their advantages but are not intended to restrict the invention.

Copper alloys (10 kg) containing the respective elements as listed in Table 1 with the balance copper and impurities, were produced by melting them at 1300° C. in a high-frequency melting furnace and casting into ingots having a thickness of 30 mm. Next, the ingots were heated in a batch furnace at 1000° C. for 3 hours, then hot rolled down to a thickness of 10 mm, and cooled rapidly after the termination of the hot rolling. Then, the surface was scarfed down to the thickness of 9 mm to remove the scales on the surface, and the plate was subjected to cold rolling to obtain a plate of length 80 mm×width 50 mm×thickness 0.286 mm. The plate was subjected to solution treatment in a continuous furnace at 950° C. for 120 seconds and thereafter was cooled with water. The cooling condition was such that the average cooling rate from the solution treatment temperature to 400° C. was 20° C./s. Subsequently, the material was coiled and subjected to the first aging treatment in an inert atmosphere in a batch furnace under the respective conditions as listed in Table 1. Thereafter, the plate was subjected to cold rolling down to 0.20 mm (the rolling reduction ratio: 30%). Finally, thermal refining annealing was effected at 300° C. for 1 min to obtain each test strip. In Example 48, the thermal refining annealing was omitted. In Comparative Example 33, after cold rolling to 0.2 mm, the material was coiled and subjected to second aging treatment in a batch furnace, wherein the second aging treatment included the first stage aging in an inert atmosphere at 300° C. for 3 hours and the second stage aging at 260° C. for 6 hours to obtain a test strip. The temperature of the material in each aging stage was kept within ±3° C. from the setting temperature listed in Table 1.

TABLE 1

| | | | | First aging treatment | | | | | | | |
|---|---|---|---|---|---|---|---|---|---|---|---|
| No Invention Example | Co | Si | Others | 1st stage Temp. (° C.) | 1st to 2nd stage Cool. rate (° C./min) | 2nd stage Temp. (° C.) | 2nd to 3rd stage Cool. rate (° C./min) | 3rd stage Temp. (° C.) | 1st stage time period (hr) | 2nd stage time period (hr) | 3rd stage time period (hr) |
| 1 | 1.3 | 0.3 | — | 480 | 0.4 | 430 | 0.4 | 310 | 8 | 2 | 4 |
| 2 | 1.3 | 0.3 | — | 480 | 0.4 | 430 | 0.4 | 350 | 12 | 6 | 6 |
| 3 | 1.3 | 0.3 | — | 480 | 0.4 | 430 | 0.4 | 350 | 12 | 6 | 30 |
| 4 | 1.3 | 0.3 | — | 480 | 0.4 | 430 | 0.4 | 350 | 12 | 12 | 6 |
| 5 | 1.3 | 0.3 | — | 480 | 0.4 | 430 | 0.4 | 350 | 12 | 12 | 30 |
| 6 | 1.3 | 0.3 | — | 510 | 0.4 | 470 | 0.4 | 400 | 6 | 6 | 6 |
| 7 | 1.3 | 0.3 | — | 510 | 0.4 | 470 | 0.4 | 400 | 6 | 6 | 15 |
| 8 | 1.3 | 0.3 | — | 510 | 0.4 | 470 | 0.4 | 400 | 6 | 12 | 6 |
| 9 | 1.3 | 0.3 | — | 510 | 0.4 | 470 | 0.4 | 400 | 6 | 12 | 15 |
| 10 | 1.3 | 0.3 | — | 540 | 0.4 | 460 | 0.4 | 300 | 6 | 6 | 6 |
| 11 | 1.3 | 0.3 | — | 540 | 0.4 | 460 | 0.4 | 380 | 3 | 6 | 6 |
| 12 | 1.3 | 0.3 | — | 540 | 0.4 | 460 | 0.4 | 380 | 3 | 6 | 30 |
| 13 | 1.3 | 0.3 | — | 540 | 0.4 | 460 | 0.4 | 380 | 6 | 1 | 6 |
| 14 | 1.3 | 0.3 | — | 540 | 0.4 | 460 | 0.4 | 380 | 6 | 6 | 4 |
| 15 | 1.3 | 0.3 | — | 540 | 0.4 | 460 | 0.4 | 380 | 6 | 6 | 6 |
| 16 | 1.3 | 0.3 | — | 540 | 0.4 | 460 | 0.4 | 380 | 6 | 6 | 30 |

TABLE 1-continued

| No | Co | Si | Others | 1st stage Temperature (°C.) | 1st to 2nd stage Cool. rate (°C./min) | 2nd stage Temperature (°C.) | 2nd to 3rd stage Cool. rate (°C./min) | 3rd stage Temperature (°C.) | 1st stage time period (hr) | 2nd stage time period (hr) | 3rd stage time period (hr) |
|---|---|---|---|---|---|---|---|---|---|---|---|
| 17 | 1.3 | 0.3 | — | 540 | 0.4 | 460 | 0.4 | 380 | 6 | 12 | 6 |
| 18 | 1.3 | 0.3 | — | 540 | 0.4 | 460 | 0.4 | 380 | 6 | 12 | 10 |
| 19 | 1.3 | 0.3 | — | 540 | 0.4 | 460 | 0.4 | 380 | 6 | 12 | 30 |
| 20 | 1.3 | 0.3 | — | 540 | 0.4 | 460 | 0.4 | 430 | 6 | 12 | 6 |
| 21 | 1.3 | 0.3 | — | 540 | 0.4 | 500 | 0.4 | 400 | 3 | 6 | 6 |
| 22 | 1.3 | 0.3 | — | 540 | 0.4 | 500 | 0.4 | 400 | 3 | 6 | 15 |
| 23 | 1.3 | 0.3 | — | 540 | 0.4 | 500 | 0.4 | 400 | 6 | 6 | 6 |
| 24 | 1.3 | 0.3 | — | 540 | 0.4 | 500 | 0.4 | 400 | 6 | 6 | 15 |
| 25 | 1.3 | 0.3 | — | 580 | 0.4 | 530 | 0.4 | 430 | 1 | 3 | 4 |
| 26 | 1.3 | 0.3 | — | 580 | 0.4 | 530 | 0.4 | 430 | 1 | 3 | 15 |
| 27 | 1.3 | 0.3 | — | 580 | 0.4 | 530 | 0.4 | 430 | 1 | 6 | 4 |
| 28 | 1.3 | 0.3 | — | 580 | 0.4 | 530 | 0.4 | 430 | 1 | 6 | 15 |
| 29 | 1.3 | 0.3 | — | 540 | 0.4 | 460 | 0.1 | 380 | 3 | 6 | 6 |
| 30 | 1.3 | 0.3 | — | 540 | 0.1 | 460 | 0.4 | 380 | 3 | 6 | 6 |
| 31 | 0.5 | 0.1 | — | 540 | 0.4 | 460 | 0.4 | 380 | 6 | 12 | 30 |
| 32 | 0.5 | 0.10 | — | 540 | 0.4 | 460 | 0.4 | 380 | 3 | 6 | 6 |
| 33 | 1.0 | 0.20 | — | 540 | 0.4 | 460 | 0.4 | 380 | 3 | 6 | 6 |
| 34 | 1.0 | 0.24 | — | 540 | 0.4 | 460 | 0.4 | 380 | 3 | 6 | 6 |
| 35 | 1.0 | 0.30 | — | 540 | 0.4 | 460 | 0.4 | 380 | 3 | 6 | 6 |
| 36 | 2.0 | 0.50 | — | 510 | 0.4 | 470 | 0.4 | 400 | 6 | 6 | 15 |
| 37 | 2.5 | 0.60 | — | 580 | 0.4 | 530 | 0.4 | 430 | 1 | 3 | 4 |
| 38 | 2.5 | 0.60 | — | 540 | 0.4 | 460 | 0.4 | 380 | 3 | 6 | 6 |
| 39 | 2.5 | 0.60 | | 510 | 0.4 | 470 | 4 | 400 | 6 | 6 | 6 |
| 40 | 1.3 | 0.3 | 0.5Cr | 540 | 0.4 | 460 | 0.4 | 380 | 3 | 6 | 6 |
| 41 | 1.3 | 0.3 | 0.5Sn | 540 | 0.4 | 460 | 0.4 | 380 | 3 | 6 | 6 |
| 42 | 1.3 | 0.3 | 0.5Zn | 540 | 0.4 | 460 | 0.4 | 380 | 3 | 6 | 6 |
| 43 | 1.3 | 0.3 | 0.5Ag | 540 | 0.4 | 460 | 0.4 | 380 | 3 | 6 | 6 |
| 44 | 1.3 | 0.3 | 0.1Mg | 540 | 0.4 | 460 | 0.4 | 380 | 3 | 6 | 6 |
| 45 | 1.3 | 0.3 | 0.1Zr | 540 | 0.4 | 460 | 0.4 | 380 | 3 | 6 | 6 |
| 46 | 1.3 | 0.3 | 0.5Mn, 0.1Mg, 0.5Zn, 0.5Ag | 540 | 0.4 | 460 | 0.4 | 380 | 3 | 6 | 6 |
| 47 | 1.3 | 0.3 | 0.01P, 0.01As, 0.01Sb, 0.01Be, 0.01B, 0.01Ti, 0.01Al, 0.01Fe, 0.01Zn | 540 | 0.4 | 460 | 0.4 | 380 | 3 | 6 | 6 |
| 48 | 1.3 | 0.3 | | 540 | 0.4 | 460 | 0.4 | 380 | 3 | 6 | 6 |

| No Comp. Example | Co | Si | Others | 1st stage Temperature (°C.) | 1st to 2nd stage Cool. rate (°C./min) | 2nd stage Temperature (°C.) | 2nd to 3rd stage Cool. rate (°C./min) | 3rd stage Temperature (°C.) | 1st stage time period (hr) | 2nd stage time period (hr) | 3rd stage time period (hr) |
|---|---|---|---|---|---|---|---|---|---|---|---|
| 1 | 1.3 | 0.3 | — | *450* | 0.4 | 430 | 0.4 | 350 | 6 | 6 | 6 |
| 2 | 1.3 | 0.3 | — | 480 | 0.4 | 430 | 0.4 | 350 | 12 | 6 | *1* |
| 3 | 1.3 | 0.3 | — | 540 | 0.4 | *375* | 0.4 | 350 | 1 | 1 | 6 |
| 4 | 1.3 | 0.3 | — | 540 | 0.4 | 460 | 0.4 | *250* | 1 | 1 | 6 |
| 5 | 1.3 | 0.3 | — | 540 | 0.4 | 460 | 0.4 | 380 | *0.5* | 6 | 6 |
| 6 | 1.3 | 0.3 | — | 540 | 0.4 | 460 | 0.4 | 380 | 1 | *0.5* | 6 |
| 7 | 1.3 | 0.3 | — | 540 | — | — | — | — | 6 | *none* | *none* |
| 8 | 1.3 | 0.3 | — | 540 | 0.4 | 460 | — | — | 6 | 6 | *none* |
| 9 | 1.3 | 0.3 | — | 540 | 0.4 | 460 | 0.4 | 380 | 6 | 6 | *1* |
| 10 | 1.3 | 0.3 | — | 540 | 0.4 | 460 | 0.4 | 380 | 6 | *50* | 6 |
| 11 | 1.3 | 0.3 | — | 540 | 0.4 | 460 | 0.4 | 380 | *15* | 6 | 6 |
| 12 | 1.3 | 0.3 | — | 540 | none 0.4 | 460 | 0.4 | 430 | 6 | 12 | *100* |
| 13 | 1.3 | 0.3 | — | 540 | 0.4 | 460 | 0.4 | *450* | 6 | 12 | 30 |
| 14 | 1.3 | 0.3 | — | 540 | 0.4 | *535* | 0.4 | 425 | 6 | 12 | 6 |
| 15 | 1.3 | 0.3 | — | *600* | 0.4 | 530 | 0.4 | 430 | 6 | 6 | 6 |
| 16 | 1.3 | 0.3 | — | 540 | 0.4 | 460 | *0.02* | 380 | 3 | 6 | 6 |
| 17 | 1.3 | 0.3 | — | 540 | *0.02* | 460 | 0.4 | 380 | 3 | 6 | 6 |
| 18 | *0.3* | *0.07* | — | 540 | 0.4 | 460 | 0.4 | 380 | 3 | 6 | 6 |
| 19 | 0.5 | 0.10 | — | 540 | 0.4 | 460 | — | — | 3 | 6 | *none* |
| 20 | 1.0 | 0.20 | — | 540 | 0.4 | 460 | — | — | 3 | 6 | *none* |
| 21 | 1.0 | 0.24 | — | 540 | 0.4 | 460 | — | — | 3 | 6 | *none* |
| 22 | 1.0 | 0.30 | — | 540 | 0.4 | 460 | — | — | 3 | 6 | *none* |
| 23 | 2.5 | 0.60 | — | 540 | 0.4 | 460 | — | — | 3 | 6 | *none* |
| 24 | *3.0* | 0.71 | — | 540 | 0.4 | 460 | 0.4 | 380 | 3 | 6 | 6 |
| 25 | 1.3 | 0.3 | 0.5Cr | 540 | 0.4 | 460 | — | — | 3 | 6 | *none* |
| 26 | 1.3 | 0.3 | 0.5Sn | 540 | 0.4 | 460 | — | — | 3 | 6 | *none* |
| 27 | 1.3 | 0.3 | 0.5Zn | 540 | 0.4 | 460 | — | — | 3 | 6 | *none* |
| 28 | 1.3 | 0.3 | 0.5Ag | 540 | 0.4 | 460 | — | — | 3 | 6 | *none* |
| 29 | 1.3 | 0.3 | 0.1Mg | 540 | 0.4 | 460 | — | — | 3 | 6 | *none* |
| 30 | 1.3 | 0.3 | 0.1Zr | 540 | 0.4 | 460 | — | — | 3 | 6 | *none* |
| 31 | 1.3 | 0.3 | 0.5Mn, 0.1Mg, 0.5Zn, 0.5Ag | 540 | 0.4 | 460 | — | — | 3 | 6 | *none* |

TABLE 1-continued

| | | | | | | | | | | |
|---|---|---|---|---|---|---|---|---|---|---|
| 32 | 1.3 | 0.3 | 0.01P, 0.01As, 0.01Sb, 0.01Be, 0.01B, 0.01Ti, 0.01Al, 0.01Fe, 0.01Zn | 540 | 0.4 | 460 | — | — | 3 | 6 | none |
| 33 | 1.3 | 0.3 | — | 540 | 0.4 | 460 | — | — | 3 | 6 | none |

The properties of each of the obtained test strips were measured in the following procedures.

As for the strength, a tensile test in the direction parallel to the rolling direction was conducted in conformity with JIS Z2241 to determine 0.2% yield strength (YS: MPa).

The electrical conductivity (EC: % IACS) was derived from the volume resistivity by double bridge in conformity with JIS H0505, "The ratio of the peak height at β angle 120° at α=25°" was obtained based on the measurement procedure as already explained, using RINT-2500V X-ray diffractometer manufactured by Rigaku Corporation.

Hanging curl was determined by the already explained measurement procedure.

As to the bending workability, the W-bending test of Badway (the bending axis is in the same direction as the rolling direction) was performed by bending the specimen plate by 90° using a W-shaped metal mold under the condition that the ratio of the thickness of the specimen plate to the bending radius is 1. Subsequently, the surface of the bent portion was observed with an optical microscope and if no crack was observed the specimen was marked with ○ (good) as acceptable in practice and if a crack was observed, the specimen was marked x (no good).

The spring bending elastic limit was determined in conformity with JIS H3130 and repeated deflection test was carried out and the surface maximum stress was measured from the bending moment by the remaining permanent distortion.

The test result for each test pieces is shown in Table 2.

TABLE 2

| No | YS (MPa) | EC (% IACS) | Kb (MPa) | Hanging Curl (mm) | Peak Height ratio at β angle 120° at α = 25° | Bending Workability |
|---|---|---|---|---|---|---|
| Example | | | | | | |
| 1 | 601 | 60 | 344 | 14 | 10.1 | ○ |
| 2 | 633 | 63 | 385 | 15 | 21.5 | ○ |
| 3 | 643 | 65 | 377 | 16 | 22.6 | ○ |
| 4 | 646 | 64 | 376 | 16 | 23.1 | ○ |
| 5 | 648 | 66 | 382 | 19 | 26.2 | ○ |
| 6 | 662 | 64 | 421 | 10 | 21 | ○ |
| 7 | 658 | 65 | 407 | 11 | 23.5 | ○ |
| 8 | 653 | 65 | 396 | 13 | 22.3 | ○ |
| 9 | 650 | 66 | 390 | 15 | 25.5 | ○ |
| 10 | 655 | 64 | 412 | 17 | 20.5 | ○ |
| 11 | 654 | 64 | 402 | 11 | 22.5 | ○ |
| 12 | 648 | 67 | 407 | 13 | 25.8 | ○ |
| 13 | 641 | 66 | 391 | 14 | 23.4 | ○ |
| 14 | 636 | 67 | 362 | 19 | 18.2 | ○ |
| 15 | 635 | 67 | 381 | 11 | 20.1 | ○ |
| 16 | 628 | 68 | 384 | 11 | 22.1 | ○ |
| 17 | 623 | 68 | 369 | 13 | 21.3 | ○ |
| 18 | 620 | 68 | 368 | 18 | 24.1 | ○ |
| 19 | 615 | 69 | 369 | 19 | 26.8 | ○ |
| 20 | 621 | 68 | 371 | 11 | 23.4 | ○ |
| 21 | 650 | 65 | 400 | 18 | 23.5 | ○ |
| 22 | 646 | 66 | 397 | 17 | 24.6 | ○ |
| 23 | 625 | 67 | 384 | 11 | 24.1 | ○ |
| 24 | 621 | 68 | 365 | 15 | 26.2 | ○ |
| 25 | 611 | 68 | 349 | 13 | 12.1 | ○ |
| 26 | 609 | 70 | 361 | 19 | 15.6 | ○ |
| 27 | 601 | 69 | 346 | 14 | 14.9 | ○ |
| 28 | 600 | 70 | 358 | 20 | 19.9 | ○ |
| 29 | 650 | 65 | 393 | 11 | 21.5 | ○ |
| 30 | 641 | 65 | 388 | 17 | 21 | ○ |
| 31 | 515 | 74 | 382 | 16 | 25.4 | ○ |
| 32 | 550 | 72 | 333 | 15 | 20.5 | ○ |
| 33 | 612 | 66 | 354 | 15 | 21.5 | ○ |
| 34 | 632 | 67 | 391 | 20 | 22.8 | ○ |
| 35 | 602 | 63 | 355 | 16 | 23.8 | ○ |
| 36 | 739 | 57 | 471 | 19 | 26.7 | ○ |
| 37 | 671 | 59 | 421 | 11 | 20.1 | ○ |
| 38 | 719 | 57 | 470 | 17 | 25.7 | ○ |
| 39 | 738 | 53 | 491 | 15 | 26.2 | ○ |
| 40 | 660 | 66 | 420 | 11 | 24.9 | ○ |
| 41 | 669 | 60 | 429 | 20 | 25.1 | ○ |
| 42 | 662 | 61 | 403 | 19 | 24.1 | ○ |
| 43 | 661 | 66 | 407 | 16 | 23.6 | ○ |
| 44 | 672 | 61 | 412 | 15 | 23.9 | ○ |
| 45 | 669 | 67 | 412 | 19 | 24.1 | ○ |
| 46 | 678 | 60 | 433 | 17 | 24.5 | ○ |
| 47 | 664 | 64 | 421 | 13 | 23.7 | ○ |
| 48 | 672 | 64 | 367 | 10 | 23.7 | ○ |
| Comp. Example | | | | | | |
| 1 | _577_ | _58_ | 358 | 12 | _9.5_ | ○ |
| 2 | 629 | 60 | _325_ | 18 | _9.8_ | ○ |
| 3 | _578_ | _59_ | _338_ | 18 | _9.1_ | ○ |
| 4 | _579_ | _58_ | _331_ | 17 | _9_ | ○ |
| 5 | _574_ | _57_ | _322_ | 17 | _8.8_ | ○ |
| 6 | _569_ | _56_ | _328_ | 12 | _8.2_ | ○ |
| 7 | 629 | 60 | _300_ | 17 | _8.8_ | ○ |
| 8 | 635 | 62 | _321_ | 11 | _9.5_ | ○ |
| 9 | 638 | 65 | _326_ | 17 | _9.7_ | ○ |
| 10 | _538_ | 71 | _279_ | 17 | _7.8_ | ○ |
| 11 | _572_ | 69 | _320_ | 11 | _8.9_ | ○ |
| 12 | _581_ | 73 | 350 | 17 | _9.7_ | ○ |
| 13 | _578_ | 69 | _326_ | 14 | _9.1_ | ○ |
| 14 | _569_ | 69 | _322_ | 16 | _8.8_ | ○ |
| 15 | _411_ | 72 | _251_ | 12 | _7.2_ | ○ |
| 16 | _579_ | 73 | _328_ | 15 | _9_ | ○ |
| 17 | _568_ | 72 | _312_ | 17 | _8.8_ | ○ |
| 18 | _490_ | 73 | 303 | 17 | 11.1 | ○ |
| 19 | 555 | 69 | _248_ | 13 | _7.1_ | ○ |
| 20 | 600 | 64 | _290_ | 15 | _7.8_ | ○ |
| 21 | 621 | 64 | _305_ | 13 | _8.5_ | ○ |
| 22 | 585 | _61_ | _272_ | 20 | _8.1_ | ○ |
| 23 | 702 | 55 | _397_ | 13 | _9.1_ | ○ |
| 24 | 720 | 56 | 477 | 13 | 20.1 | X |
| 25 | 650 | 63 | _339_ | 10 | _8.5_ | ○ |
| 26 | 655 | 57 | _335_ | 20 | _8.8_ | ○ |
| 27 | 649 | 58 | _336_ | 13 | _8.1_ | ○ |
| 28 | 658 | 64 | _334_ | 19 | _7.8_ | ○ |
| 29 | 649 | 59 | _338_ | 14 | _8.0_ | ○ |
| 30 | 643 | 64 | _333_ | 16 | _8.0_ | ○ |
| 31 | 659 | 58 | _340_ | 17 | _8.1_ | ○ |

TABLE 2-continued

| No | YS (MPa) | EC (% IACS) | Kb (MPa) | Hanging Curl (mm) | Peak Height ratio at β angle 120° at α = 25° | Bending Work-ability |
|---|---|---|---|---|---|---|
| 32 | 649 | 61 | _338_ | 12 | 7.8 | ○ |
| 33 | 661 | 66 | 412 | _35_ | 9.8 | ○ |

Observations

Inventive Examples No. 1-48 had "the ratio of the peak height at β angle 120° at α=25°" of at least 10 times and exceled in the balance among strength, electrical conductivity and the spring bending elastic limit and hanging curl was suppressed. Moreover, they exceled in bending workability.

Comparative Example No. 7 is an example where the first aging was performed in one stage aging. The spring bending elastic limit was low.

Comparative Examples No. 8, 19-23 and 25-32 are examples where the first aging was effected in two stage aging. The spring bending elastic limit was low. Comparative Example 22 had a low electrical conductivity with respect to strength.

Comparative Example No. 5 is an example where the first stage aging time was short. Strength, electrical conductivity and spring bending elastic limit were low.

Comparative Example No. 11 is an example where the first stage aging time was long. Strength and spring bending elastic limit were low.

Comparative Example No. 1 is an example where the first stage aging temperature was low. Strength and electrical conductivity were low.

Comparative Example No. 15 is an example where the first stage aging temperature was high. Strength and spring bending elastic limit were low while electrical conductivity was high.

Comparative Example No. 6 is an example where the second stage aging time was long. Strength and spring bending elastic limit were low.

Comparative Example No. 10 is an example where the second stage aging was long. Strength and spring bending elastic limit were low.

Comparative Example No. 3 is an example where the temperature at the second stage aging was low. Strength, electrical conductivity and spring bending elastic limit were low.

Comparative Example No. 14 is an example where temperature at the second stage aging temperature was high. Strength and spring bending elastic limit were low.

Comparative Examples No. 2 and No. 9 are examples where the third stage aging time was short. Spring bending elastic limit was low.

Comparative Example No. 12 is an example where the third aging time was long. Strength was low.

Comparative Example No. 4 is an example where the temperature at the third stage aging was low. Strength and electrical conductivity and spring bending elastic limit were low.

Comparative Example No. 13 is an example where the third stage aging temperature was high. Strength and spring bending elastic limit were low.

Comparative Example No. 16 is an example where the cooling rate from the second stage to the third stage was low. Strength and spring bending elastic limit were low.

Comparative Example No. 17 is an example where the cooling rate from the first stage to the second stage was low. Strength and spring bending elastic limit were low.

Comparative Example No. 33 is an example where the first aging was conducted with the two stage aging and the second aging was also carried out. Hanging curl was large.

All of the above Comparative Examples had "the ratio of the peak height at β angle 120° at α=25°" of less than 10 times and were inferior to the inventive Examples with respect to the balance among strength, electrical conductivity and hanging curl.

Comparative Example No. 18 had low Co and Si concentrations, resulting in low strength.

Comparative Example No. 24 is an example where "the ratio of the peak height at β angle 120° at α=25°" was at least 10 times and the balance among strength, electrical conductivity and spring bending elastic limit was excellent but the properties were comparative to those of Example 35 in spite of the increased Co concentration by 0.5%. Thus, the cost performance was the problem. Also, the bending workability was lowered owing to the too high Co concentration.

Figure 2:
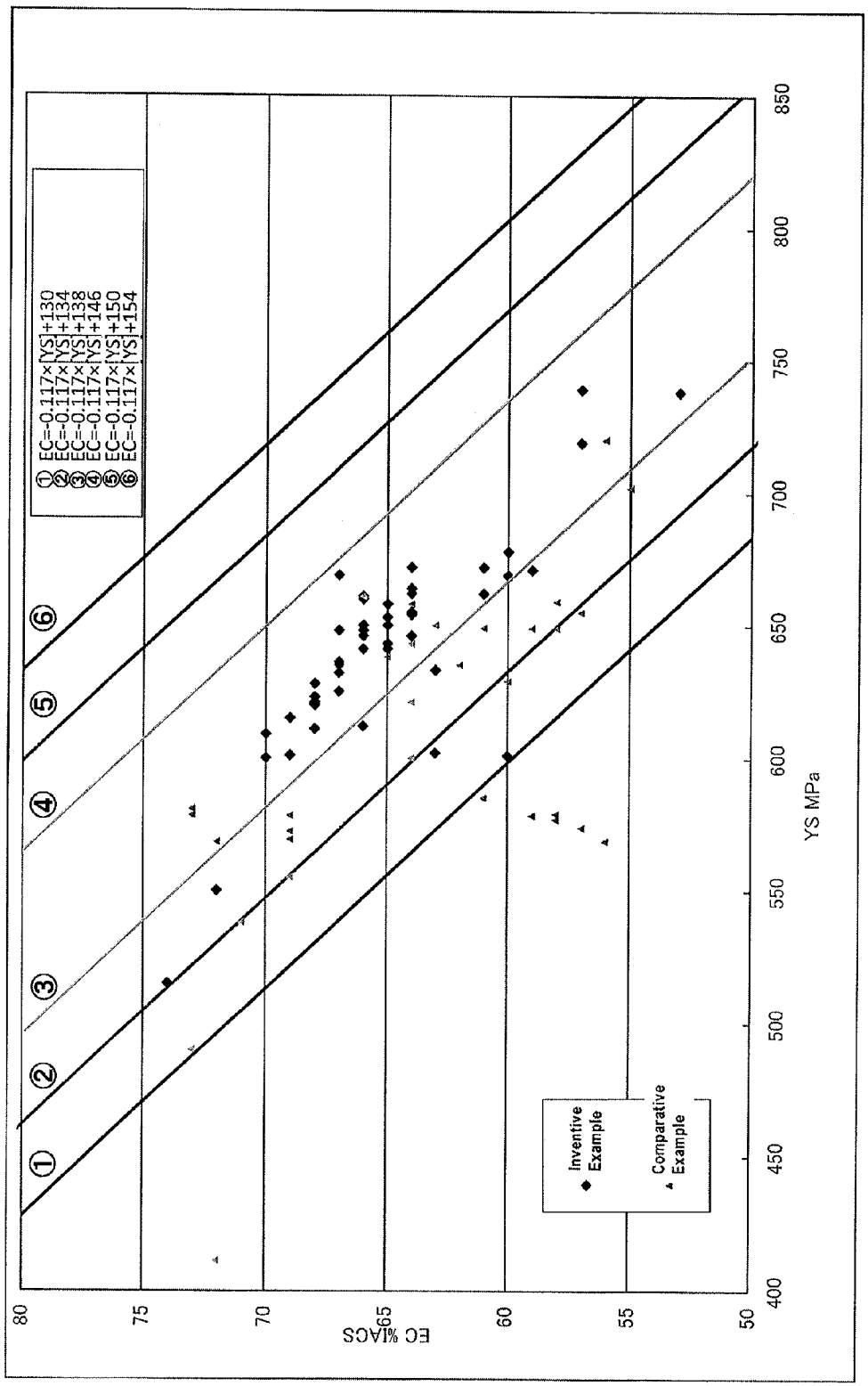
FIG. 2 is a graph plotted with the YS as x-axis and the EC as y-axis.
Figure 3:
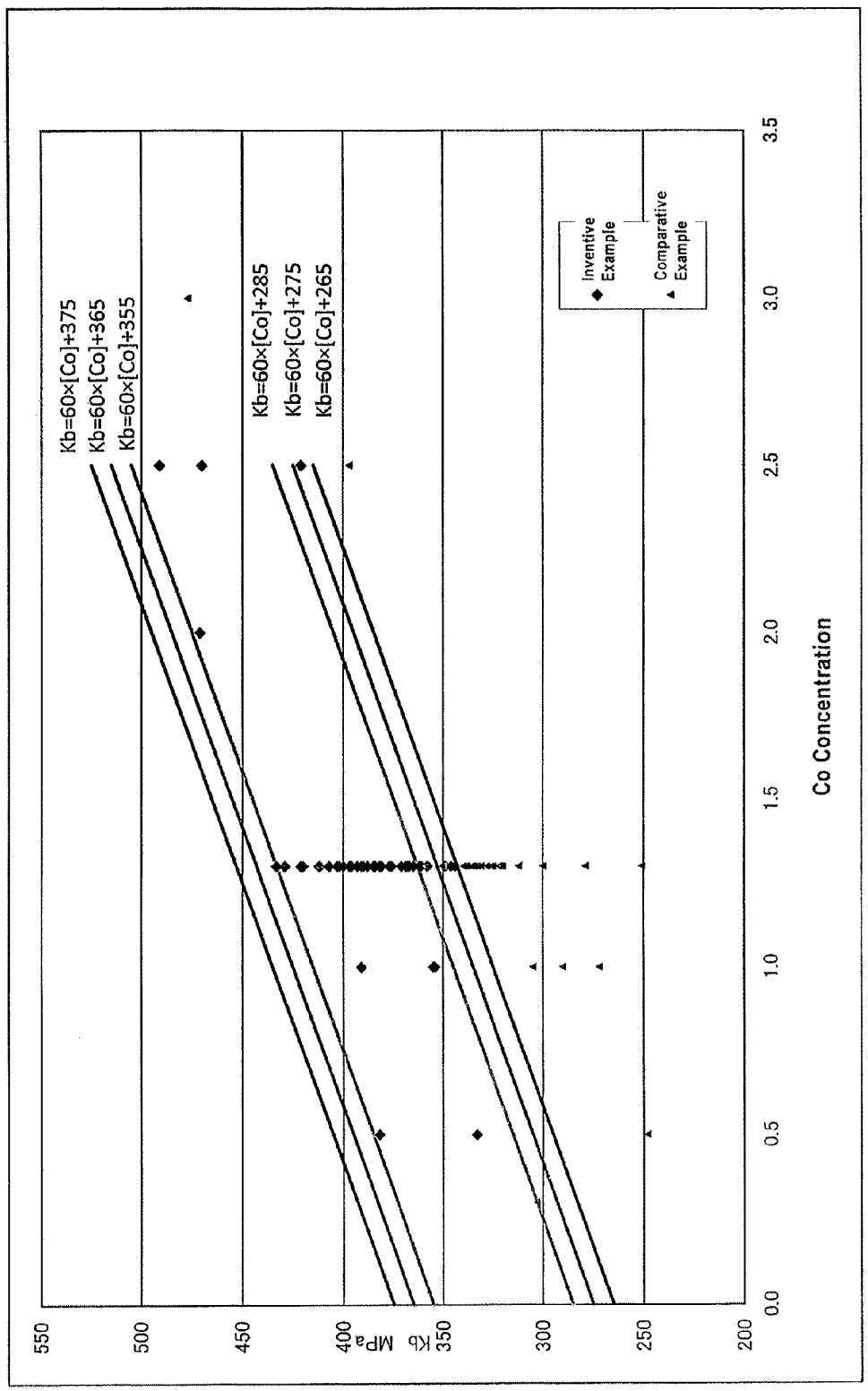
FIG. 3 is a graph plotted with the Co mass % concentration as x-axis and the Kb as the y-axis.

With respect to the inventive examples and the comparative examples, a graph plotted with the Co concentration (mass %) as x-axis and the YS as y-axis is shown in FIG. 1; a graph plotted with the YS as x-axis and EC as y-axis is shown in FIG. 2; and a graph plotted with the Co as x-axis and Kb as y-axis is shown in FIG. 3, respectively.

From FIG. 1, it is seen that Formula a: $-55\times[Co]^2+250\times[Co]+500 \geq YS \geq -55\times[Co]^2+250\times[Co]+350$ is satisfied.

From FIG. 2, it is seen that Formula b: $-0.117\times[YS]+130 \leq EC \leq -0.117\times[YS]+154$ is satisfied, and From FIG. 3, it is seen that Formula c: $-60\times[Co]+265 \leq Kb \leq 60\times[Co]+375$ is satisfied.

The invention claimed is:

1. A copper alloy strip for electronic materials comprising 0.5-2.5 mass % of Co, 0.1-0.7 mass % of Si, optionally containing 1.0 mass % or less of Ni, further optionally containing at least one element selected from the group consisting of Cr, Mg, P, As, Sb, Be, B, Mn, Sn, Ti, Zr, Al, Fe, Zn and Ag in an amount not exceeding 2.0 mass % in total, the balance Cu and inevitable impurities, wherein, from a result obtained from measurement of an X ray diffraction pole figure, using a rolled surface as a reference plane, the following (a) is satisfied:
   (a) a diffraction peak height at β angle=120° among diffraction peak intensities by β scanning at α=25° in a {200} pole figure is at least 10 times that of standard copper powder; and
   wherein the following formula is satisfied, where Co content (mass %) is expressed by [Co] and spring bending elastic limit is expressed by Kb (MPa):

Formula c: $60\times[Co]+265 \leq Kb \leq 60\times[Co]+375$; and wherein a hanging curl in a direction parallel with a rolling direction is 35 mm or less.

2. The copper alloy strip according to claim 1, wherein the following formula is satisfied, where Co content (mass %) is expressed by [Co] and 0.2% yield strength is expressed by YS (MPa):

Formula a: $-55\times[Co]^2+250\times[Co]+500 \geq YS \geq -55\times[Co]^2+250\times[Co]+350.$ 3. The copper alloy strip according to claim 1, wherein the following formulae are satisfied, where the 0.2% yield strength is expressed by YS (MPa) and the electrical conductivity is expressed by EC (% IACS):

$$500 \leq YS \leq 800, 50 \leq EC \leq 75 \text{ and}$$

$$-0.117 \times [YS] + 130 \leq EC \leq -0.117 \times [YS] + 154. \quad \text{Formula b:}$$

4. A method for producing a copper alloy strip according to claim 1, which comprises steps in the following sequence:
- step 1 of melting and casting an ingot having a composition as claimed in claim 1;
- step 2 of heating the ingot at 900° C.-1050° C. for at least 1 hour, and thereafter subjecting it to a hot rolling;
- step 3 of cold rolling;
- step 4 of conducting solution treatment at 850-1050° C. and then cooling with an average cooling rate to 400° C. of at least 10° C./sec;
- multi-stage aging step 5 comprising a first stage of heating the material at 480° C.-580° C. for 1-12 hours, then a second stage of heating the material at 430-530° C. for 1-12 hours, and then a third stage of heating the material at 300-430° C. for 4-30 hours, wherein the cooling rates from the first stage to the second stage and from the second stage to the third stage are at least 0.1° C./min respectively, and a temperature difference between the first stage and the second stage is 20-80° C. and a temperature difference between the second stage to the third stage is 20-180° C. and wherein the multiple stage aging is performed in a batch furnace with the material in a coiled condition, and
- step 6 of cold rolling.

5. The method for producing a copper alloy strip according to claim 4, wherein, after the step 6, a thermal refining annealing step is carried out by heating the material at a temperature of 200-500° C. for 1-1000 seconds.

6. A wrought copper product comprising the copper alloy strip as claimed in claim 1.

7. An electronic component comprising the copper alloy strip as claimed in claim 1.

* * * * *